United States Patent
Changchein et al.

(10) Patent No.: US 7,746,142 B2
(45) Date of Patent: Jun. 29, 2010

(54) CIRCUIT AND METHOD FOR CLOCK SKEW COMPENSATION IN VOLTAGE SCALING

(75) Inventors: Wei-Pin Changchein, Taichung (TW); Shu Yi Ying, Taichung (TW); Fu-Lung Hsueh, Cranberry, NJ (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 85 days.

(21) Appl. No.: 12/250,224

(22) Filed: Oct. 13, 2008

(65) Prior Publication Data

US 2010/0090738 A1    Apr. 15, 2010

(51) Int. Cl.
G06F 1/04 (2006.01)
(52) U.S. Cl. .......................... 327/291; 327/333; 327/141
(58) Field of Classification Search .................. None
See application file for complete search history.

(56) References Cited

U.S. PATENT DOCUMENTS

| | | | |
|---|---|---|---|
| 5,422,915 A * | 6/1995 | Byers et al. | 375/357 |
| 7,352,227 B2 * | 4/2008 | Shiratake et al. | 327/333 |
| 7,411,439 B2 * | 8/2008 | Brox et al. | 327/333 |
| 7,551,002 B1 * | 6/2009 | Reuland et al. | 326/93 |
| 2008/0115004 A1 * | 5/2008 | Braun et al. | 713/401 |

* cited by examiner

*Primary Examiner*—Cassandra Cox
(74) *Attorney, Agent, or Firm*—Slater & Matsil, L.L.P.

(57) ABSTRACT

Circuit and methods for automatic clock skew compensation in circuits having two power domains. When one of the power domains is operated with a lowered supply voltage, lowering the supply voltage tends to slow the clock pulse and produces clock skew. Circuitry is provided for selectively delaying the clock pulse in one of the power domains to reduce the clock skew by comparing the clock pulses, and then automatically delaying the clock pulse in one of the domains by a delay determined to minimize the skew. A method is provided where the clock skew between two clock pulses is determined and the delay needed in one of the clock pulses to reduce the skew is determined by sampling the clock skew using a plurality of delays at multiples of a minimum delay, and then automatically delaying the one clock pulse by selecting an appropriate delay. The method may be iterated.

19 Claims, 9 Drawing Sheets

CIRCUIT AND METHOD FOR CLOCK SKEW COMPENSATION IN VOLTAGE SCALING

TECHNICAL FIELD

The present invention relates to circuits and methods for providing improved clock skew compensation in semiconductor devices with voltage scaling. Voltage scaling is increasingly used to conserve power in integrated circuit devices by reducing the supply power (typically referred to as "Vdd") to a portion of the circuitry during certain periods. The clock in use in the portion of the circuit subject to voltage scaling often crosses the power domains, so that the same clock timing is in use in another portion of the circuit that has different supply voltages. Reducing the supply voltage in one power domain or portion of the integrated circuit while maintaining the supply voltage in another domain or portion produces additional clock skew, which must be addressed. The present invention is directed to providing an improved circuit and methods that effectively provide efficient and effective clock skew compensation for integrated circuits using voltage scaling.

BACKGROUND

In integrated circuits, power consumption and management of power is a critical issue. The reduction of power consumption has become and continues to be increasingly important as more devices are manufactured for battery use, such as portable devices. In the prior art, the use of voltage scaling to reduce power consumption is practiced. Voltage scaling reduces the supply voltage level to portions of an integrated circuit. Often power management techniques are incorporated that detect time periods when a portion of the circuit is less active, or idle, and the power supply to that portion may be reduced. Various phrases describing voltage scaling are used. Dynamic voltage scaling (DVS), adaptive voltage scaling (AVS) and module level voltage scaling (MLVS) are all described in the literature relating to integrated circuits.

A problem that inherently arises when supply voltage level scaling is used in an integrated circuit is cross power domain clock skew. That is, when a clock signal is used in two power domains, and one of them has a voltage supply that changes due to voltage scaling, an increase in clock skew will typically occur. The design used to implement the circuit therefore must be performed with such tolerances that the clock skew does not create erroneous operation. As is known, if a set up time requirement for a data register is violated, or a hold time requirement is violated, the register may not function correctly. Metastable or oscillating operation may occur, or a register may erroneously "flash through" passing data to the output in the wrong clock cycle.

FIG. 1 depicts, as a simplified example, registers and a clock tree for two portions or domains within a single integrated circuit of the prior art. In FIG. 1, a circuit is shown receiving a clock signal labeled CK into two power domain regions, power domain 1 (labeled "PD1") and power domain 2 (labeled "PD2"). In PD1, a clock tree circuit 10 comprised of a plurality of parallel buffer circuits 11 is shown. As is known in the art, a clock tree is used to fan out a heavily loaded clock signal to various registers or loads so that each load receives a rising and falling edge of the signal CK at very close to the same time, so that the circuitry may correctly latch and hold data inputs as Q outputs of synchronous registers in the circuit. A typical register 13 is shown receiving a clock pulse CP1 in PD1. Similarly, power domain PD2 is subject to voltage scaling and comprises a clock tree 15 of buffers 17 which receive the clock pulse CK and fan out the local clock signals. Register 19 receives a clock pulse CP2. Register 19 is coupled to register 13 in PD1, thus the registers communicate across the two power domains. PD1 is not subject to supply voltage scaling; however, PD2 is subject to supply voltage scaling.

FIG. 2 depicts a typical timing diagram for clock pulses CP1 and CP2 when the supply voltages for PD1 and PD2 are the same. In FIG. 2, no difference in time is apparent at the rising edge of CP1 and CP2, that is, there is no clock skew between the domains PD1 and PD2. In contrast, in FIG. 3, the effect of voltage scaling in PD2 is shown. The timing diagram of FIG. 3 shows the relative timing of the rising edges of CP1 and CP2 when the voltage scaling is in effect. In FIG. 3, there is a time difference between the rising edges, and clock skew is occurring. As the supply voltage to the circuitry in PD2 is reduced, the time delays increase and thus, CP2 arrives later in time to register 19 than CP1 arrives to register 13. If this skew increases to a large skew (in time), erroneous operation of the two registers may occur.

A continuing need thus exists for an improved clock skew compensation circuit and methods that provide for robust operation of the clocked circuits across power domains even when voltage scaling is applied to a portion of the circuitry.

SUMMARY OF THE INVENTION

These and other problems are generally solved or circumvented, and technical advantages are generally achieved, by embodiments of the present invention, which provides circuits and methods for automatically compensating for clock skew between portions of the circuitry, or power domains. The circuits and methods may compensate for skew where one power domain is subject to voltage scaling and another power domain in the integrated circuit is not, and further the circuits and methods may also automatically compensate for clock skew when voltage scaling is applied to both of the power domains simultaneously.

In one exemplary embodiment, circuitry for automatically compensating for clock skew between two power domains is provided. A comparator is provided coupled to clock pulses from each power domain, and a skew is determined between the two clock pulses. A selectable delay circuit for delaying one of the clock pulses by integer multiples of a minimum delay is provided. A plurality of delayed pulses of one of the one clock pulses, each delay also being a multiple of the minimum clock pulse, is provided. Samples of the clock skew are taken using each of the delayed pulses. Control logic examines the samples and automatically selects the appropriate delay to apply to the one clock pulse to minimize the skew.

In another exemplary embodiment, the above described circuitry is provided and the selectable delay circuit is provided using a multiplexer and a plurality of delay lines each having a delay that is an integer multiple of a minimum delay time.

In another exemplary embodiment, the above described circuitry is provided wherein the voltage supply to the second power domain is subject to supply voltage scaling. In yet another exemplary embodiment, the above described circuit is provided wherein the voltage supply to both the first and second power domains is subject to supply voltage scaling.

In an exemplary method embodiment, clock skew between two power domains both having clock pulses derived from the same clock input signal is compensated automatically by determining the skew between the two clock pulses, determining an appropriate delay from a plurality of delays to be applied to one of the two clock pulses to reduce the skew, and selecting the delay for the one clock pulse to be applied to reduce the skew. In another exemplary method embodiment, the above method is performed and the steps are iterated. In another exemplary embodiment, the above method is performed wherein determining an appropriate delay further comprises providing a plurality of delayed pulses from the one clock pulse, each being delayed by an integer multiple of a minimum delay time, sampling the skew signal using the plurality of delayed pulses to form a plurality of samples, and examining the plurality of samples to determine the appropriate delay to apply to the one clock pulse. In another exemplary method embodiment, the above described method is provided wherein the examining of the plurality of samples further comprises determining the location of a leading zero in the sample pattern. In another exemplary method embodiment, the above described method is provided wherein the examining of the plurality of samples further comprises disregarding samples that may violate known set up and hold time requirements and determining the location of a leading zero in a manner that avoids metastable samples.

In yet another exemplary embodiment, an integrated circuit having two power domains and two clock domains corresponding to the two power domains is provided including an automatic skew compensation circuit for reducing skew between the clock pulses of the two clock domains.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

The drawings, schematics and diagrams are illustrative, not intended to be limiting but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
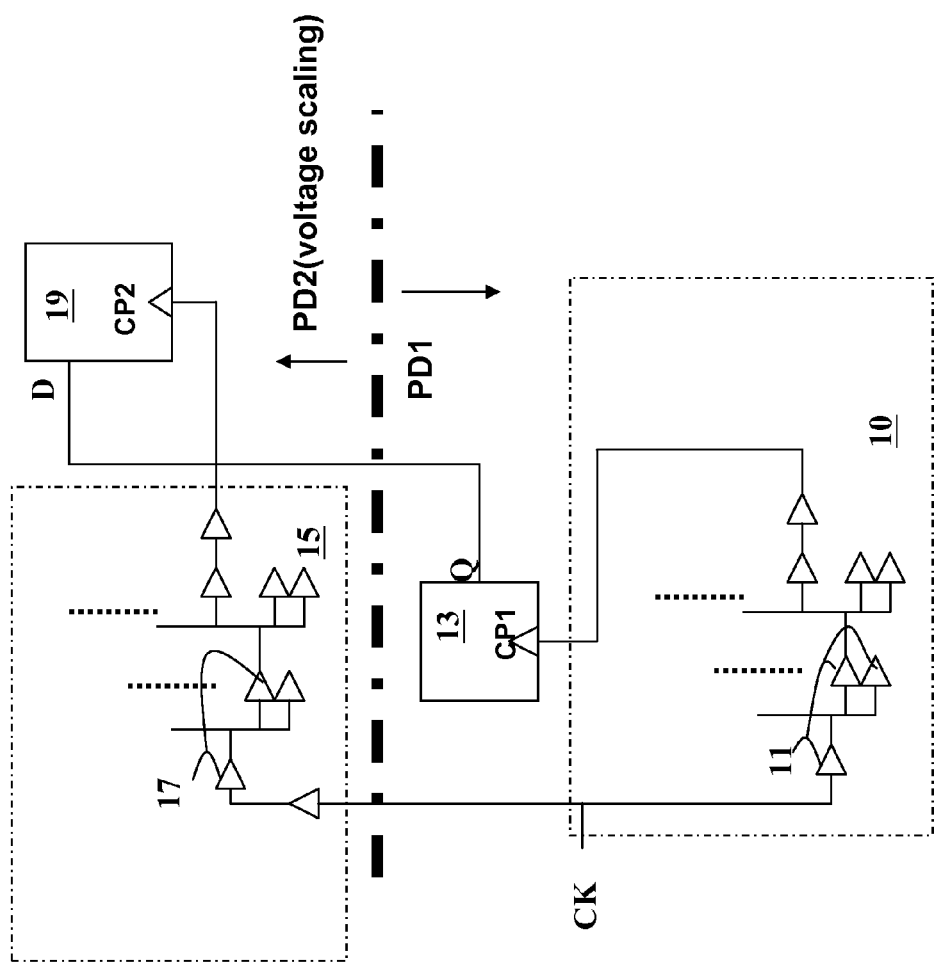
FIG. 1 illustrates in a simplified circuit diagram a prior art circuit.
Figure 2:
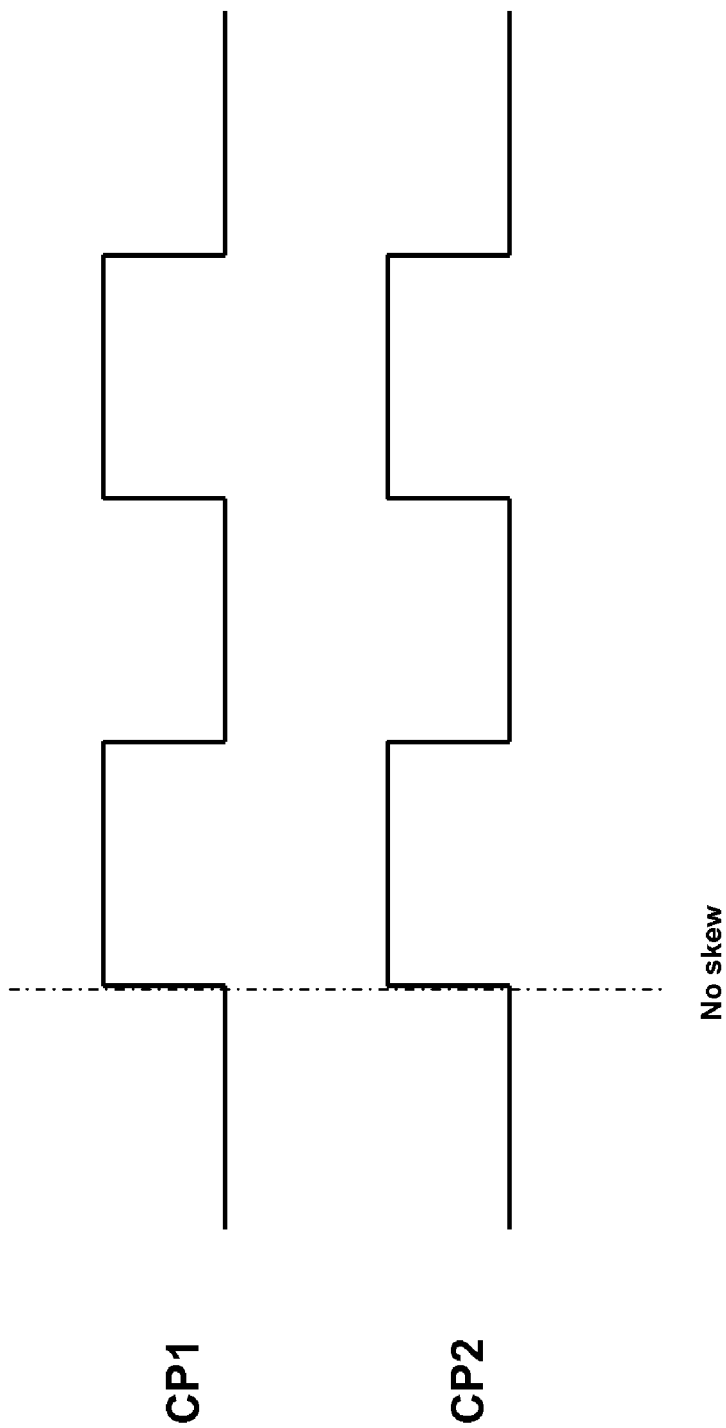
FIG. 2 illustrates a timing diagram illustrating two clock domains without skew.
Figure 3:
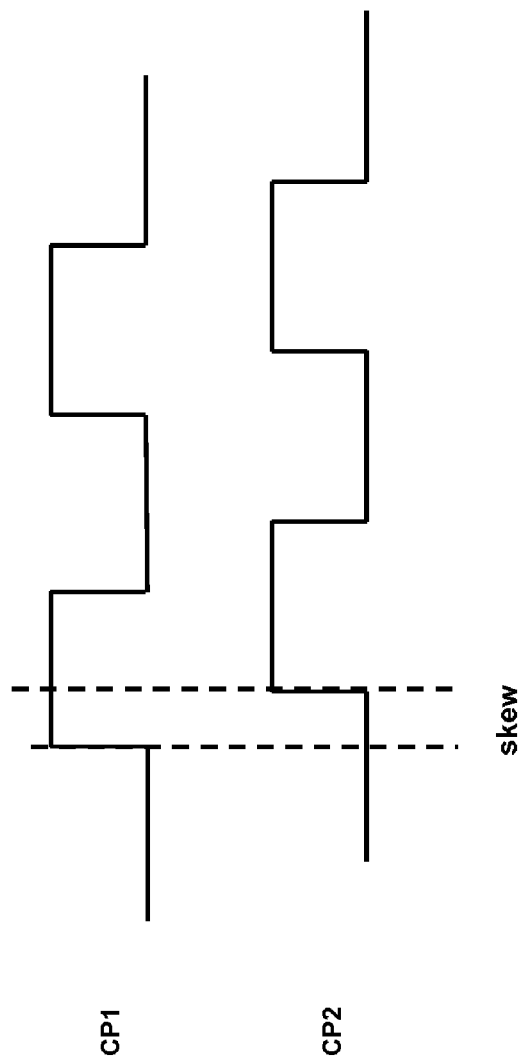
FIG. 3 illustrates in another timing diagram illustrating two clock domains with skew.
Figure 4:
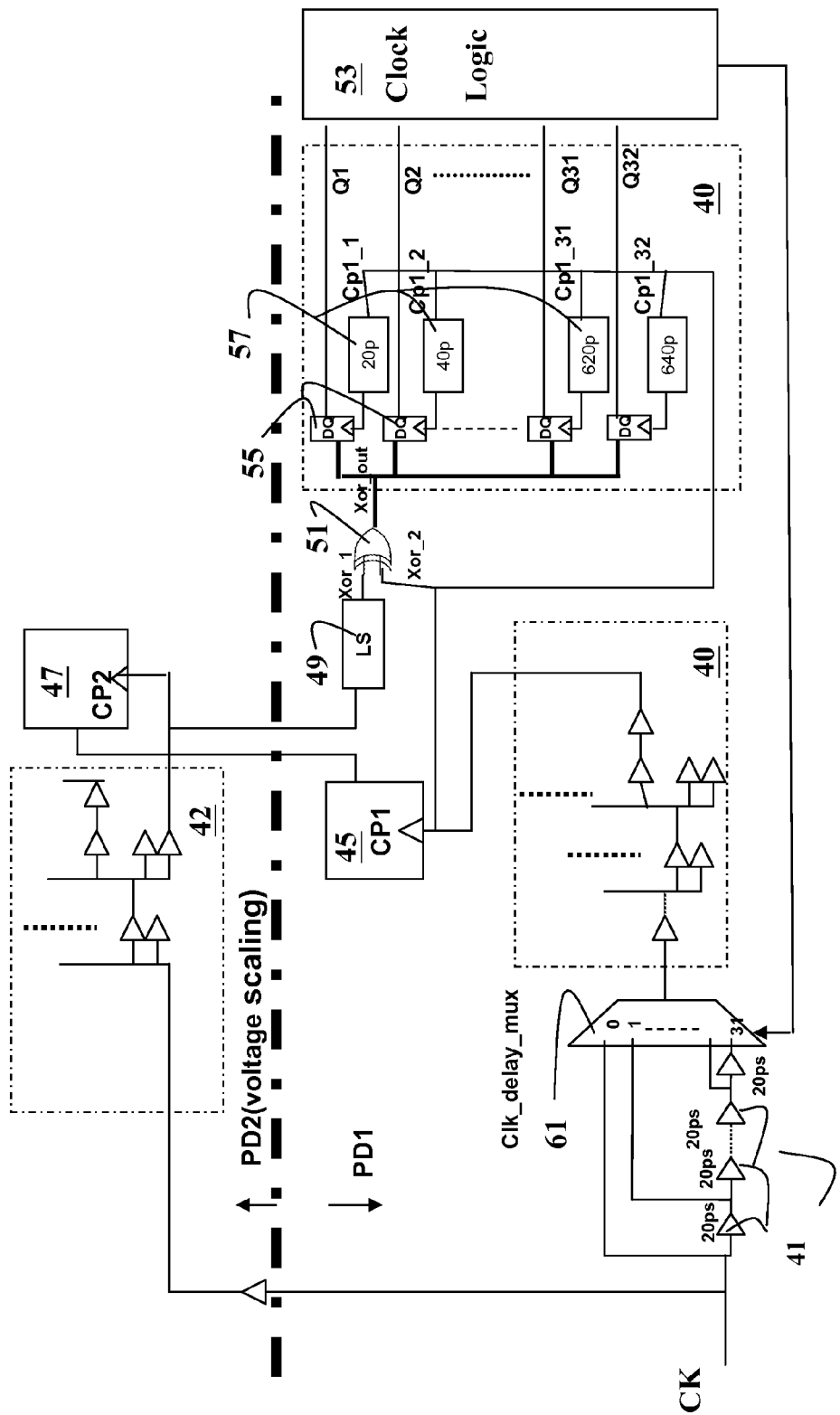
FIG. 4 illustrates in a simplified circuit diagram a first exemplary embodiment of the skew compensation circuitry of the present invention.

FIG. 4 depicts in a circuit diagram an illustrative exemplary embodiment of a voltage scaling clock skew compensation circuit of the present invention. In FIG. 4, a clocked circuit 47, for example a register, receives a clock pulse CP2 from a clock tree 42. The clock tree may be a single buffer but is more typically a plurality of buffers arranged to provide a more or less equal clock delay to the registers in power domain PD2. Circuit 47 and clock tree 42 are located in a power domain region PD2 of an integrated circuit, which is subject to voltage scaling. Another clocked circuit 45 receives clock pulse CP1 from clock tree 40. Circuit 45 and clock tree 40 are in a second power domain PD1, which for this illustrative example is not subject to voltage scaling. Clock tree 40 may also be a simple buffer but is more typically a plurality of buffers arranged to ensure the clock signal arrives at various registers within the power domain PD1 at approximately the same instant in time.

The voltages applied to the power domains may be any of a variety of supply voltages. For example, the voltage supplied to power domain PD2 might be 3.3 Volts, while the voltage supplied to power domain PD1 might be 5 Volts. As voltages used in integrated circuits fall with advances in semiconductor process technology, these voltages will also tend to be reduced. For example, the supply voltage in power domain PD2 might be 1.0 Volts, while the power supplied in power domain PD1 might be 1.8 Volts. In another example, the power supplied in power domain PD2 might be 0.7 Volts while the power supplied in power domain PD1 might be 1.0 Volts. Generally, reducing the power supplied to a power domain that forms a portion of an integrated circuit results in lower power consumption and thus, these trends will continue and a variety of voltages is contemplated by the embodiments described herein for each power domain, and these alternative embodiments fall within the scope of the appended claims. In alternative embodiments to be discussed in more detail later, both power domains PD1 and PD2 could be subject to voltage scaling. The two clocked circuits 45 and 47 are coupled so that a signal crosses the power domain boundary and thus, clock skew between CP1 and CP2 is an issue, as in the prior art.

A clock delay multiplexer 61 is positioned between the clock input labeled CK and the clock tree 40 in power domain PD1. Multiplexer 61 has, in this non limiting example, 32 inputs which are delays varying from 0 picoseconds (ps) to 640 picoseconds. The number of inputs to the multiplexer may be more, or fewer, for a given application. Conveniently, these inputs are created by feeding the clock signal CLK into a delay line with 32 taps, each delay stage 41 adding 20 picoseconds of delay. The amount of delay for the taps in the delay line may also be varied according to the needs of a particular application and the embodiment shown is a non limiting exemplary illustration. Thus, by manipulating the control inputs to multiplexer 61 and selecting the correct one of the inputs to the clock delay multiplexer 61 in FIG. 4, the timing of the clock pulse CP1 may be adjusted with respect to pulse CP2 and therefore any skew between CP2 and CP1 may be eliminated, or at least minimized.

The embodiment of FIG. 4 further includes circuitry for determining which of the inputs to the clock delay multiplexer 61 provides the least amount of skew between CP1 and CP2. Level shifter LS 49 returns the clock pulse CP2 to the required power domain PD1 voltage in the power domain PD1 to enable a voltage comparison with CP1. Exclusive OR gate 51 is an illustrative comparator, although other forms could be used. Gate 51 compares clock pulse CP1 and CP2. The output of this gate Xor_out will be high when either one of the two clock pulses is high, but not the other, thus this comparison is providing a clock skew measurement as a voltage on signal Xor_out.

Registers 55 provide a portion of a convenient circuit for determining the offset needed to compensate for the skew. Each register 55 receives as a D input the Xor_output signal. Each register 55 is clocked by a version of CP1 produced by a different delay 57 added to clock pulse CP1. Each delay line 57 is an integer multiple of the minimum delay time, which is 20 picoseconds in this example. By observing which registers properly capture the Xor_out signal for a particular cycle, the clock logic 53 can output the correct selection for clock delay mux 61 to minimize the skew. This may be done automatically, that is, without user intervention, during operations of an integrated circuit; and the compensation may be updated as the voltages change or other variables cause skew to increase between clock signals CP1 and CP2.

Figure 5:
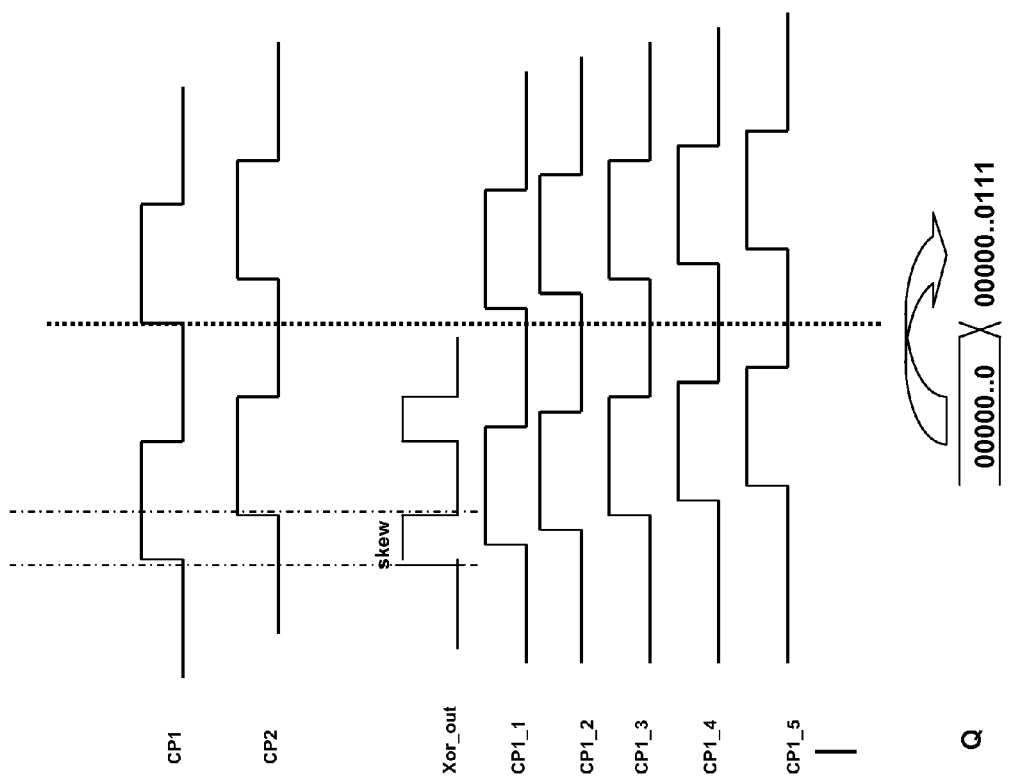
FIG. 5 illustrates a first timing diagram for the circuit of FIG. 4.

FIG. 5 illustrates a first timing diagram to show the operation of the compensation circuitry in FIG. 4. In FIG. 5, the clock pulses CP1 and CP2 are shown prior to the application of any compensation. CP1 is quite a bit earlier in time than CP2, recall that CP2 is in the voltage scaled power domain and that clock tree circuit has a lowered supply voltage with respect to the power domain PD1 where CP1 is produced, and so typically CP2 will be later in time than CP1.

The output Xor_Out in the trace shows the skew pulse that is developed by comparing the two clock pulses. This pulse is input into the registers 55 in FIG. 4 and the delayed pulses CP1_1, CP1_2 will clock that column of registers in 20 picosecond delayed intervals.

The bottom row of FIG. 5 depicts the expected outputs of the registers 55. As the Xor_out signal is a "1" during the rising edge of the clock pulses CP1_1, CP1_2, CP1_3, and a "0" for the remaining delayed clock pulses, the registers 55 will output 0000 . . . 0111 as shown in FIG. 5.

Figure 6:
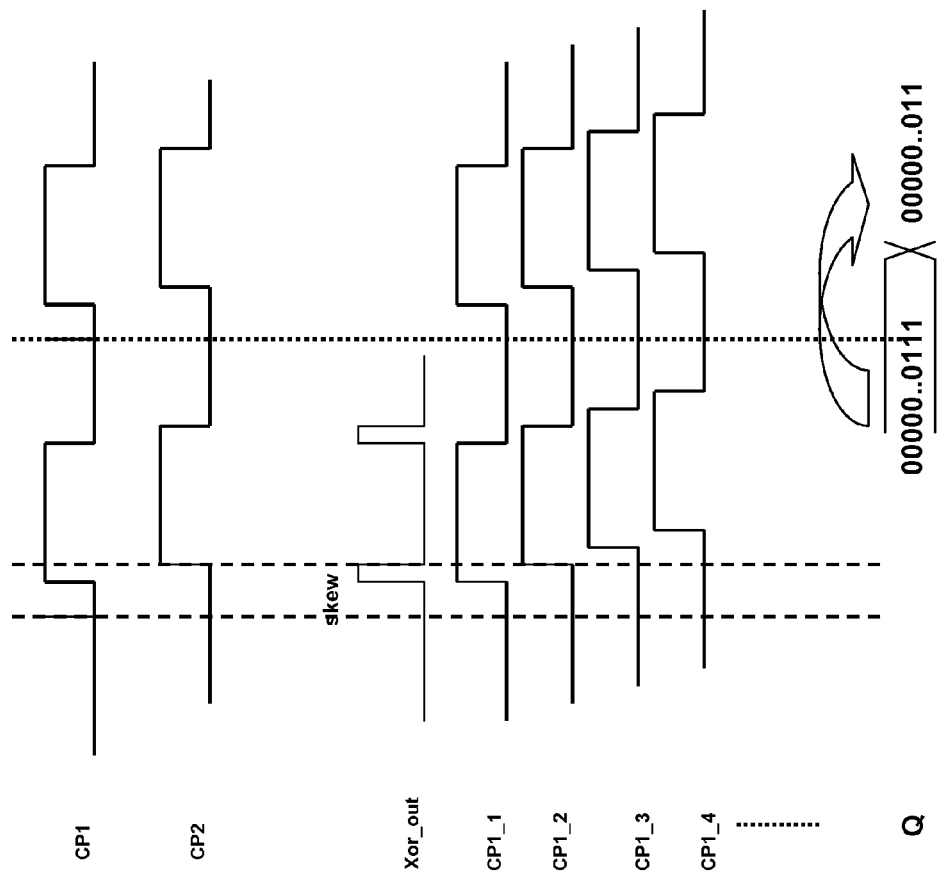
FIG. 6 illustrates a second timing diagram for the circuit of FIG. 4.

The timing diagram in FIG. 6 now depicts the signals for the same points in the circuit of FIG. 4 after the clock skew compensation has been applied. As can be seen by the top two traces, clock pulse CP1 is now delayed with respect to clock pulse CP2 and as a result, the rising edges CP1 and CP2 are quite close in time. This is reflected by a very narrow pulse output from the exclusive OR gate as shown in the third trace for the signal Xor_out. Now the trace labeled Q at the bottom of FIG. 6 shows the change in the pattern, when the delayed pulses CP1_1 . . . CP1_32 arrive in this example, only the first two registers CP1_1 and CP1_2 will capture a "1".

By selecting the delay from the Q pattern that matches the "leading zero", the delay selected for the control lines into the clock_delay_mux 61 will be optimal. Further, this process may optionally continue in an iterative fashion until the clock skew is minimized or eliminated, in a stepwise or repetitive fashion, and obtain the optimal result. In an ideal example, when all of the Q outputs are zero, then, there is no skew (output on the Xor_out signal is zero for all samples).

However, each circuit design is also subject to certain timing requirements that further impact the correct selection for the control lines to the mux 61. These requirements are provided as parameters or rules in the design library for a particular semiconductor process. As is known generally, each clocked register in a circuit design in a particular process technology has a pair of timing requirements on the data input timing known as "set up" and "hold". In order to properly store a data input, the data must be present and stable for a time period prior to the sampling clock edge (usually a rising edge) at least as long as the "set-up" time and it must remain unchanged for a period at least as long as a "hold" time after the clock edge arrives. The sum of these two times produces a minimum data pulse width that can be reliably sampled on the data input by an arriving clock edge.

If the set-up/hold times are violated for a particular register, because the data changes closer to the arriving clock edge than the set-up minimum time, or because the date changes after the arriving clock edge sooner than the hold minimum time, the output of the register may be a metastable, or oscillating output. This register output is not reliable and the data must be ignored.

Figure 7:
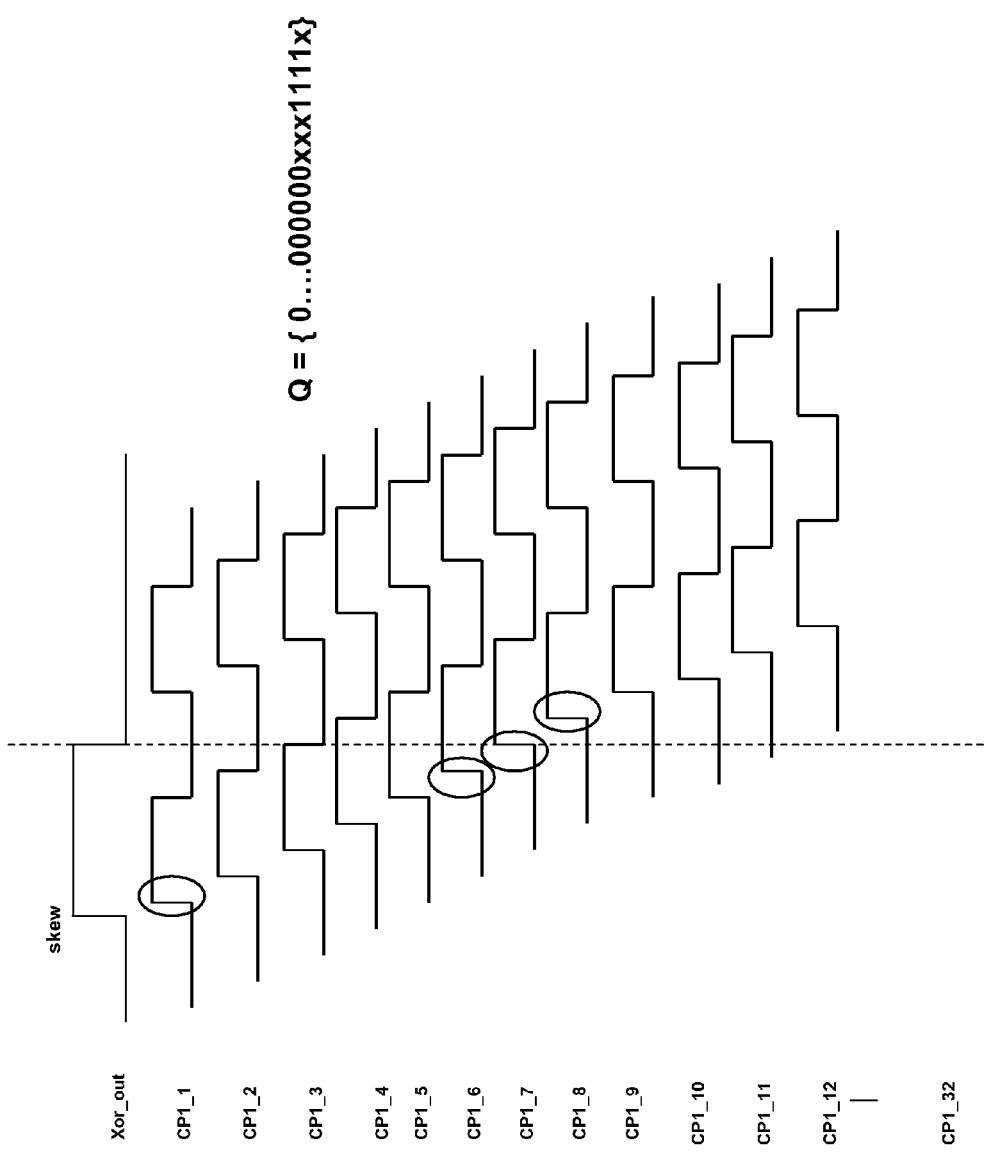
FIG. 7 illustrates in a timing diagram the timing for certain clock pulses used in the circuit diagram of FIG. 4.

FIG. 7 illustrates, in one example, the operation of the circuit of FIG. 4 taking these requirements into account. In FIG. 7, the expected Q pattern will include four outputs from registers that are predicted to be metastable. The signal Xor_out changes just before pulse CP1_1 has a rising edge. The output of that register will be expected to be metastable or unknown, represented by the "x" in the "Q" pattern shown. The Xor_out signal also changes to a low value shortly after the CP1_6, CP1_7 and CP1_8 pulses arrive. Thus, these registers 1, 6, 7 and 8 are subject to a either a "set-up" or "hold time" violation and can likewise be predicted to have metastable outputs. The "Q" pattern in FIG. 7 illustrates this, with an "x" indicating a metastable register output.

Thus, instead of simply choosing the position of the first "leading zero", the clock logic 53 in FIG. 4 must also be configured to account for these requirements. Correct operation with minimal skew may be accomplished by considering the setup and hold requirements and choosing the appropriate delay value taking these into account. For example, if the delay resolution is 20 picoseconds (minimum difference between taps) and the setup time added to the hold time for a given process library is 50 picoseconds, the clock logic circuit 53 in FIG. 4 should be configured to look for three consecutive "0s" prior to the first metastable output to ensure the setup and hold requirements are met and only reliable data is used. The minimum skew adjustment available is thus 60 picoseconds.

The dashed box 40 in FIG. 4 around the registers sampling the Xor_out signal with the delayed clock pulses CP1_1 to CP1_32 to form the Q outputs for use by the clock logic 53 indicates that alternative embodiments, described in greater detail below, may be used to form these outputs.

Figure 8:
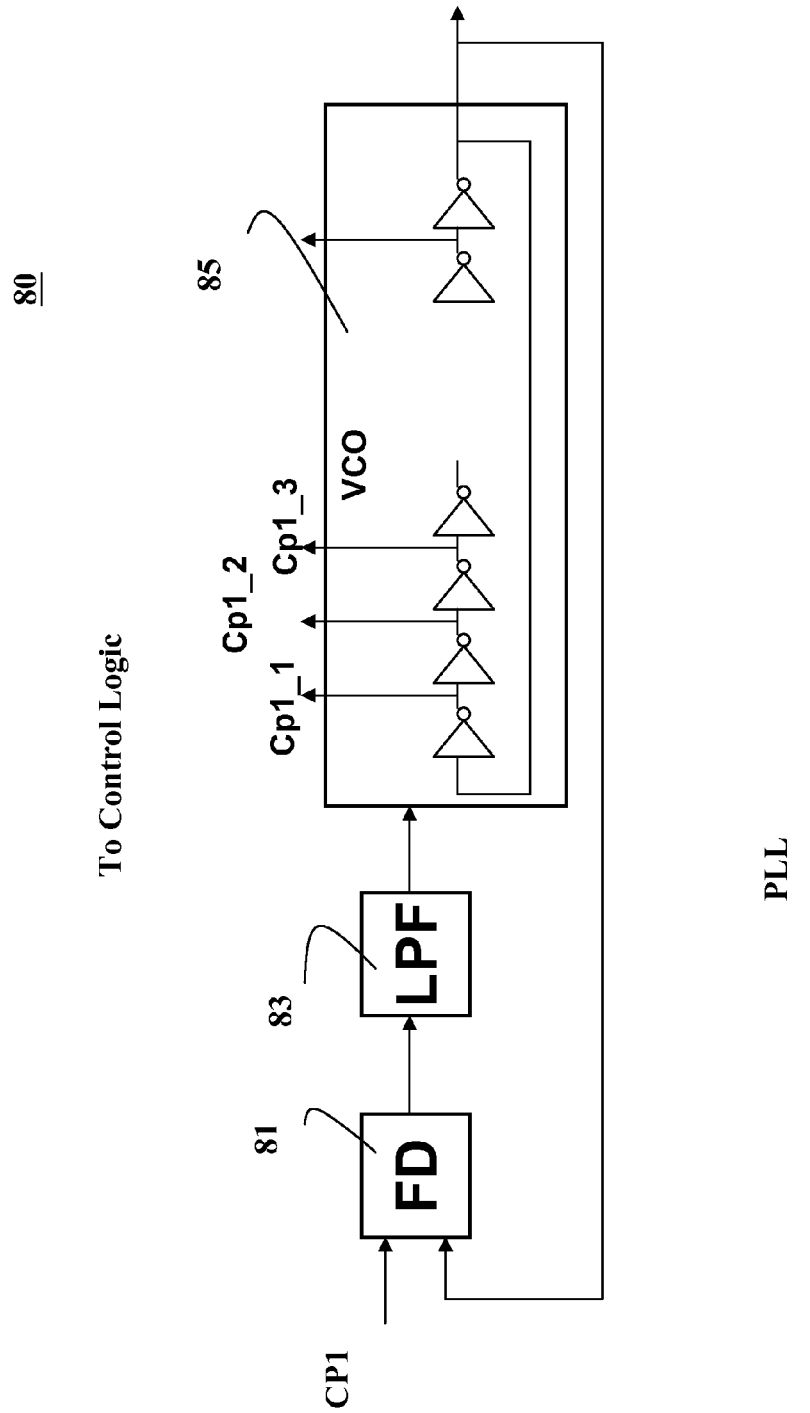
FIG. 8 illustrates in a simplified circuit diagram an alternative circuit for implementing a portion of the exemplary embodiment of FIG. 4, forming another exemplary embodiment.

FIG. 8 depicts an alternative embodiment for forming the delayed clock pulses CP1_1 to CP1_32 for use by the circuitry in FIG. 4. In phase locked loop (PLL) circuit 80, the clock signal CP1 is provided to a first block FD 81, which is a phase detector circuit and the output is subjected to a low pass filtering operation by LPF circuit 83. A ring oscillator 85 then provides the incrementally delayed pulses CP1_1 to CP1_32 from the clock pulse signal CP1. These pulses are then used to clock the registers 55 in FIG. 4 to provide the Q1-Q32 samples to the clock logic 53. These clock pulses with different phases are more resistant to process variation problems and so this approach may be preferred for certain applications to the delay lines approach used in FIG. 4, circuit 40.

Figure 9:
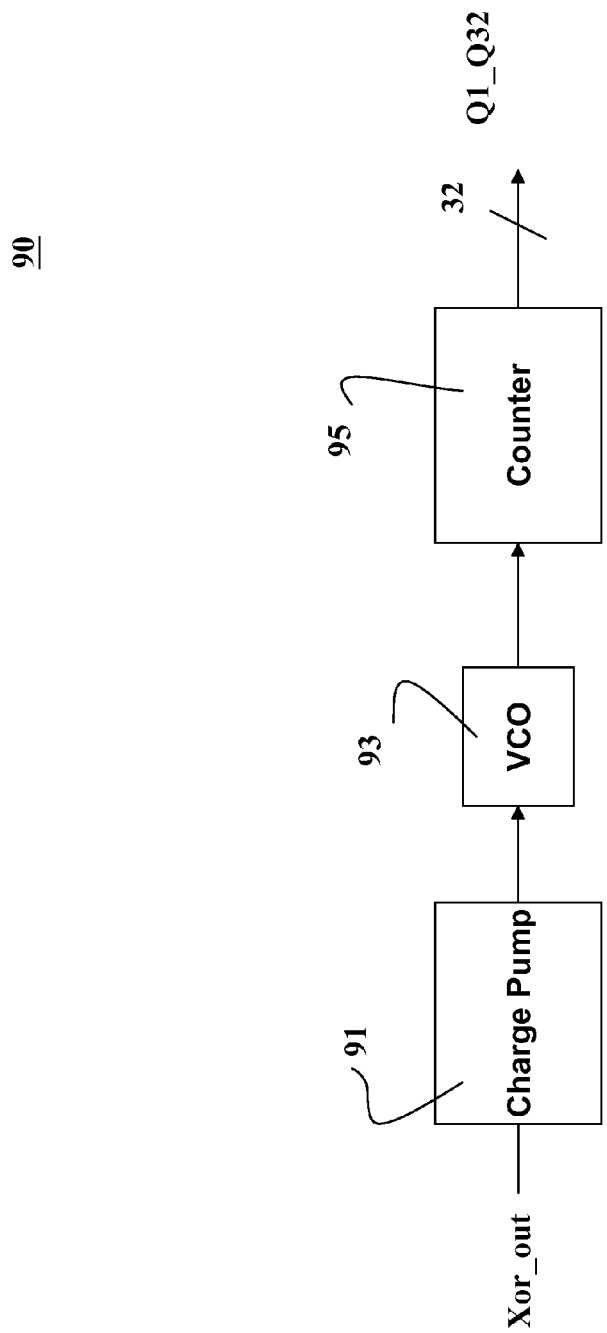
FIG. 9 illustrates in another simplified circuit diagram another alternative circuit for implementing a portion of the exemplary embodiment of FIG. 4, forming yet another exemplary embodiment.

FIG. 9 depicts another alternative embodiment for an analog approach 90 to providing the Q1_Q32 signals needed for the clock logic 53 in FIG. 4. In this approach, the output of the exclusive OR gate of FIG. 4 is input to a charge pump 91. The longer the Xor_out signal is in time, the greater the voltage will be output by the charge pump. A voltage controlled oscillator then outputs a pulse stream with a frequency determined by the voltage from the charge pump. This pulse stream then clocks a counter 95, and the count will increase as the VCO output 93 increases in frequency, providing the Q outputs for the clock logic circuitry 53 in FIG. 4.

Clock logic circuit 53 in FIG. 4 may typically be implemented using a synchronous state machine, as is known in the art. However, other approaches such as a look up table, microcontroller, microprocessor, or other programmable logic device may also be used to implement the function of selecting the input into the clock delay mux 61 to correctly compensate for the skew due to the difference in power levels between the two power domains.

As described above, the supply voltage to power domain 2 in FIG. 4 may be lowered (voltage scaling) to conserve power. However, the approach to skew compensation will also work when the power to the power domain 1 is scaled or changed. The compensation circuitry for the skew difference between the two clock domains will work without respect to which domain exhibits skew with respect to the other domain.

The circuitry described above may be formed in a single integrated circuit, or in a system or circuit board having multiple integrated circuits. The power domains PD1 and PD2 typically will be formed as part of a single integrated circuit with various other circuitry, however the embodiments and the appended claims are not limited to this application.

An exemplary method for automatically compensating for the clock skew between two power domains in a circuit or integrated circuit comprises determining the skew, providing a selectable delay for a clock pulse in one of the two power domains, sampling the skew with a plurality of delayed pulses from the clock pulse in the one of the two power domains, determining from the sample a delay that will minimize the skew between the two power domains, and selecting the delay for the one clock pulse responsive to the determining step.

Advantages of these embodiments include providing a method, or circuitry, for automatically compensating for skew that results from applying supply voltage scaling to a power domain in a circuit that was initially designed for a higher supply voltage. That is, even though the circuit was initially designed without consideration of this clock skew due to supply voltage scaling, the embodiments described above may automatically reduce the clock skew when scaling is applied.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A skew compensation circuit for minimizing clock skew between two power domains in a circuit, comprising:
   an input for receiving a clock signal;
   a first power domain clock circuit coupled to the input for outputting a first clock pulse, and having a first power supply voltage;
   a second power domain clock circuit coupled to the input for outputting a second clock pulse, and having a second power supply voltage lower than the first power supply voltage;
   a selectable delay circuit for providing one of a plurality of delays between the input and the first clock pulses, responsive to a control input;
   a skew comparator for determining the skew between the first clock pulse and the second clock pulse;
   a pulse delay circuit for outputting a plurality of delayed pulses from the first clock pulse;
   a skew sampling circuit for sampling the output of the skew comparator using the plurality of delayed pulses and for outputting a plurality of samples; and
   control logic for outputting the control input to the selectable delay circuit after determining from the samples a delay amount for the first clock pulse that will minimize the clock skew.

2. The skew compensation circuit of claim 1, wherein the selectable delay circuit further comprises a plurality of delays of incremental multiples of a minimum delay and a selection circuit for selecting the delay to be applied to the first clock pulse.

3. The skew compensation circuit of claim 1, wherein the skew comparator further comprises an exclusive OR gate coupled to the first and second clock pulses.

4. The skew compensation circuit of claim 1, wherein the second power domain clock circuit is subject to voltage scaling to reduce the second supply voltage.

5. The skew compensation circuit of claim 4, wherein the first supply voltage is 5 Volts.

6. The skew compensation circuit of claim 4, wherein the second supply voltage is 3.3 Volts.

7. The skew compensation circuit of claim 5, wherein the second supply voltage is 1.0 Volts.

8. The skew compensation circuit of claim 4, wherein the first power domain clock circuit is also subject to voltage scaling to reduce the first supply voltage.

9. The skew compensation circuit of claim 1, wherein the control logic comprises a synchronous state machine.

10. The skew compensation circuit of claim 1, wherein the pulse delay circuit further comprises a plurality of delay lines each being an integer multiple of a minimum delay.

11. The skew compensation circuit of claim 10, wherein the skew sampling circuit further comprises a plurality of clocked registers having the skew comparator output as an input and being clocked by a respective one of the plurality of delay lines.

12. The skew compensation circuit of claim 1, wherein the pulse delay circuit further comprises a phase locked loop circuit outputting a plurality of delayed pulses each being an integer multiple of a minimum delay.

13. The skew compensation circuit of claim 1, wherein the pulse delay circuit further comprises a charge pump coupled to the skew comparator output and a voltage controlled oscillator coupled to the charge pump, the voltage controlled oscillator outputting a stream of clock pulses proportional to the length of the skew comparator output.

14. The skew compensation circuit of claim 13, wherein the pulse delay circuit further comprises a counter coupled to the stream of clock pulses and outputting a count value proportional to the length of the skew comparator output.

15. The skew compensation circuit of claim 1, wherein the control logic further comprises logic operable to examine the samples and to determine the delay value that will minimize the skew, eliminating samples that violate the set up and hold times of the sampling registers.

16. An integrated circuit having automatic skew compensation between two clock domains, comprising:
- a first power domain clock circuit coupled to the input for outputting a first clock pulse, and having a first power supply voltage;
- a second power domain clock circuit coupled to the input for outputting a second clock pulse, and having a second power supply voltage lower than the first power supply voltage;
- circuitry clocked by the first power domain clock circuit that has an output coupled to circuitry within the second power domain clocked by the second power domain clock;
- a selectable delay circuit for providing a one of a plurality of delays between the input and the first clock pulses, responsive to a control input;
- a skew comparator for determining the skew between the first clock pulse and the second clock pulse;
- a pulse delay circuit for outputting a plurality of delayed pulses from the first clock pulse;
- a skew sampling circuit for sampling the output of the skew comparator using the plurality of delayed pulses and for outputting a plurality of samples; and
- control logic for outputting the control input to the selectable delay circuit after determining from the samples a delay amount for the first clock pulse that will minimize the clock skew.

17. The integrated circuit of claim 16, wherein the selectable delay circuit further comprises a multiplexer coupled to delay the first clock pulse by a delay that is one of a plurality of delay lines, responsive to the control input.

18. The integrated circuit of claim 16, wherein the first power supply is greater than two volts.

19. The integrated circuit of claim 18, wherein the second power supply is less than two volts.

\* \* \* \* \*